United States Patent
Wang et al.

(10) Patent No.: US 6,364,956 B1
(45) Date of Patent: Apr. 2, 2002

(54) PROGRAMMABLE FLUX GRADIENT APPARATUS FOR CO-DEPOSITION OF MATERIALS ONTO A SUBSTRATE

(75) Inventors: Youqi Wang, Atherton; Xin Di Wu, San Jose, both of CA (US)

(73) Assignee: Symyx Technologies, Inc., Santa Clara, CA (US)

( * ) Notice: Subject to any disclaimer, the term of this patent is extended or adjusted under 35 U.S.C. 154(b) by 0 days.

(21) Appl. No.: 09/237,502

(22) Filed: Jan. 26, 1999

(51) Int. Cl.[7] .............................................. C23C 16/00
(52) U.S. Cl. ................................ 118/726; 118/723 EB; 392/388; 219/121.15; 204/298.01
(58) Field of Search .......................... 118/726, 723 EB; 392/388, 389, 390; 219/121.15; 204/298.01, 298.04, 298.11, 298.12

(56) References Cited

U.S. PATENT DOCUMENTS

| | | | | |
|---|---|---|---|---|
| 4,121,537 A | * | 10/1978 | Maruyama et al. | 118/664 |
| 4,389,295 A | * | 6/1983 | Davey et al. | 204/192.26 |
| 4,776,868 A | * | 10/1988 | Trotter, Jr. et al. | 65/17.4 |
| 4,814,056 A | | 3/1989 | Welty | 204/298 |
| 5,091,320 A | * | 2/1992 | Aspnes et al. | 427/8 |
| 5,556,472 A | * | 9/1996 | Nakamura et al. | 118/719 |
| 6,045,671 A | * | 4/2000 | Wu et al. | 204/298.11 |
| 6,063,436 A | * | 5/2000 | Pavell et al. | 427/162 |
| 6,142,097 A | | 11/2000 | Tomofuji | |

FOREIGN PATENT DOCUMENTS

| | | |
|---|---|---|
| FR | 1 409 289 A | 12/1965 |
| WO | WO 98/47613 | 10/1998 |

OTHER PUBLICATIONS

Linker et al., Aug. 1, 1996, Physica C, NL, North–Holland Publishing, Amsterdam, vol.: 266 (3–4) pp. 271–277 "The effect of Y and Ba contents on the properties of YbaCuO thin films".

Saunders et al., 1987, J. of Material Science Letters, vol. 6, pp. 1179–1181 "Use of vapor co–deposited thin films containing assesment of phase equilibria in binary and ternary alloy systems".

Jandeleit et al., 1999, Angew Chem., Int. Ed, vol. 38: pp. 2494–2532 " Combinatorial Materials Science and Catalysis".

Hanak, J J, 1970, J. of Material Sciences, vol.: 5, pp. 964–971 "The "Multiple–Sample Concept" in Materials Research: Synthesis, Compositional Analysis and Testing of Entire Multicomponent Systems".

E.M. Da Silva et al., "Variable Thun Film Thickness Apparatus", (IBM Technical Disclosure Bulletin vol. 22 No. 7, Dec. 1979) p. 2922.

X.–D. Xiang et al. "A Combinatorial Approach to Materials Discovery", (Science vol. 268 Jun. 23, 1995) pp. 1738–1740.

* cited by examiner

Primary Examiner—Gregory Mills
Assistant Examiner—Sylvia MacArthur

(57) ABSTRACT

An apparatus for simultaneously depositing gradients components of two or more target materials onto a substrate is disclosed. The apparatus comprises a first target material source that directs a first target material towards the substrate and a second target material source that directs a second material towards the substrate. The apparatus further comprises a gradient shutter system that blocks a first predetermined amount of the first target material and a second predetermined amount of the second target material directed towards the substrate in order to generate gradients of the first and second target materials on the substrate. The gradients of the first and second target materials being simultaneously deposited onto the substrate to form a homogenous resulting material. A method for simultaneously depositing gradients of two or more target material onto a substrate is also disclosed.

19 Claims, 8 Drawing Sheets

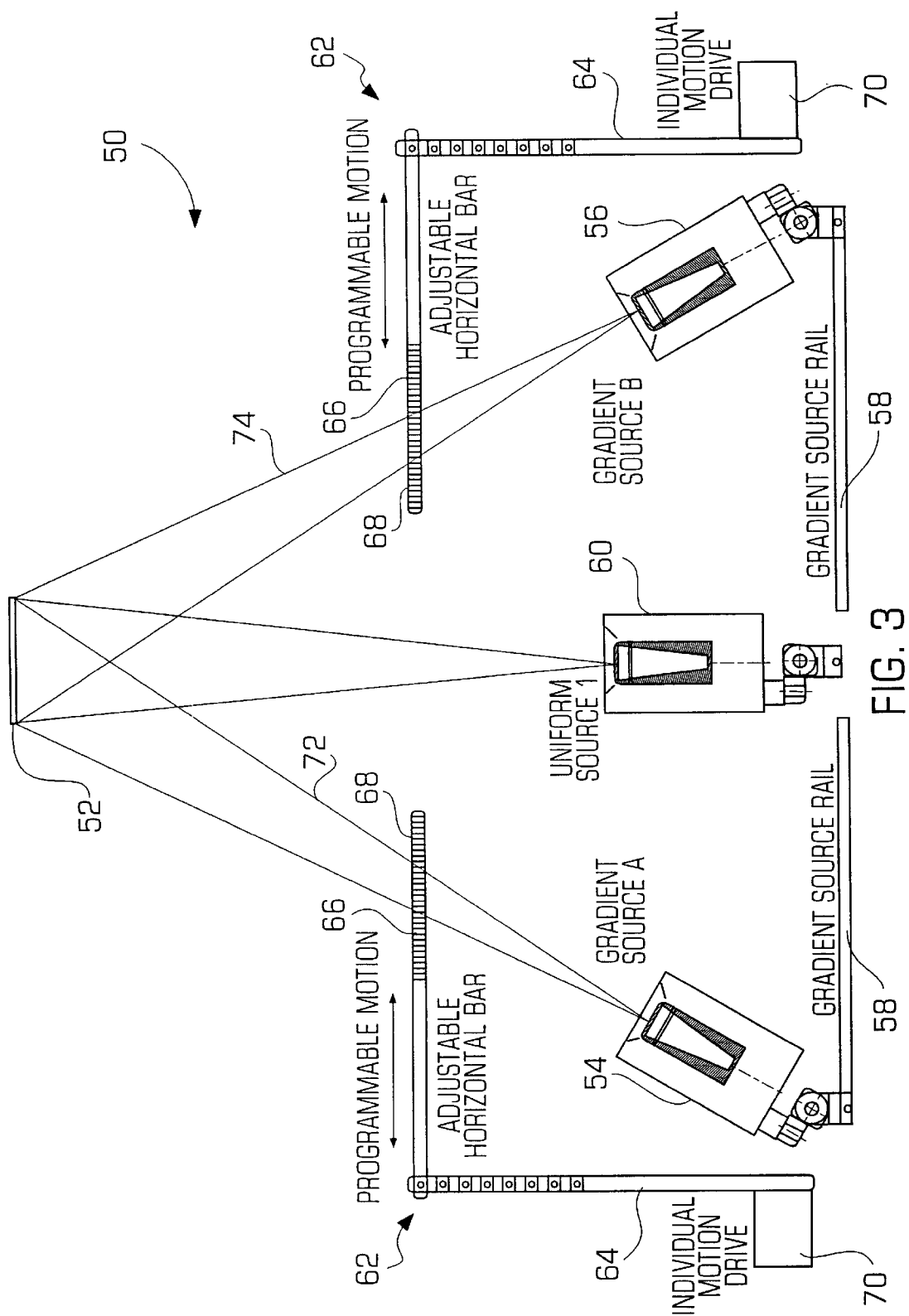

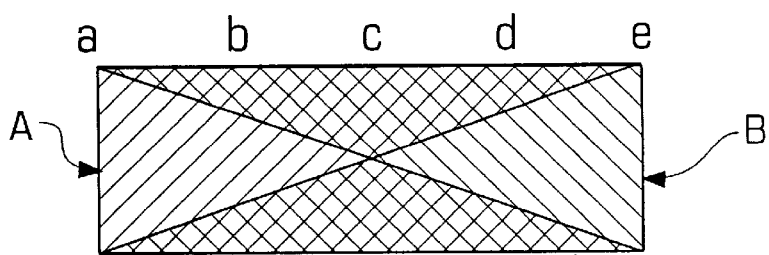
FIG. 6A
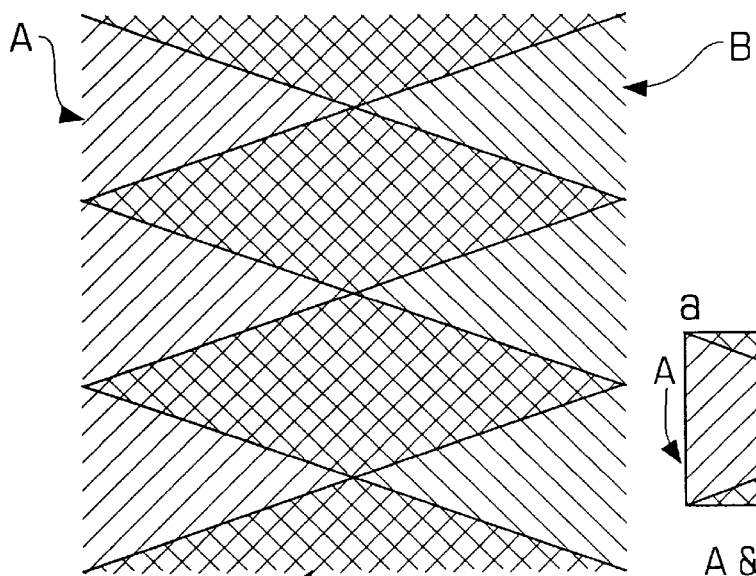
FIG. 6B
A & B MIXTURE
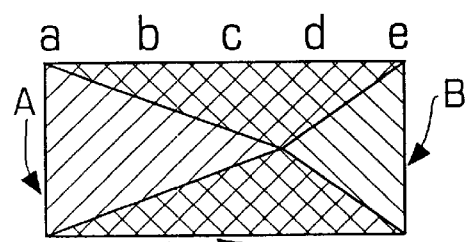
A & B MIXTURE
FIG. 6C
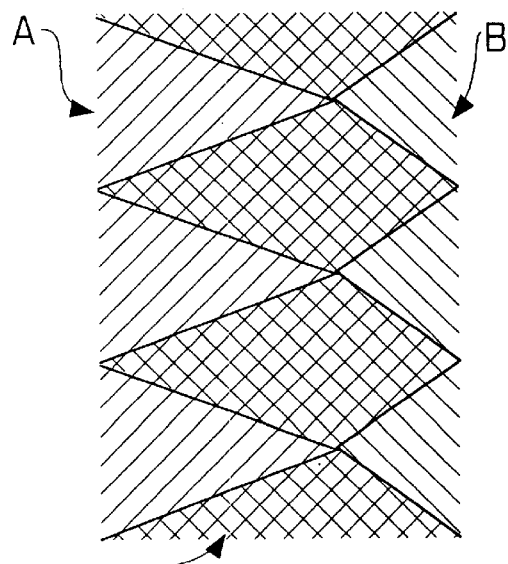
A & B MIXTURE    FIG. 6D

PROGRAMMABLE FLUX GRADIENT APPARATUS FOR CO-DEPOSITION OF MATERIALS ONTO A SUBSTRATE

BACKGROUND OF THE INVENTION

This invention relates generally to an apparatus and method for depositing one or more materials onto a substrate and in particular to an apparatus and method for depositing one or more materials onto a substrate with one or more composition gradients.

Combinatorial material science refers generally to methods for creating a collection of chemically diverse compounds or materials and to methods for rapidly testing or screening this library of compounds or materials for desirable characteristics or properties. The combinatorial technique, which was introduced to the pharmaceutical industry in the late 1980s, has dramatically increased the drug discovery process. Recently, combinatorial techniques have been applied to the synthesis of organic and inorganic materials. Using various surface deposition techniques, masking strategies or processing conditions, it is possible to generate hundreds or thousands of materials with distinct compositions per square inch in an array of elements which form a library. The materials generated using these combinatorial techniques have included high temperature superconductors, magnetoresistors, phosphors and pigments. The discovery of new catalysts should also benefit from these combinatorial techniques. General combinatorial material science methodologies are disclosed, for example, in U.S. Pat. No. 5,776,359 which is incorporated herein by reference.

Using these combinatorial material science techniques, a substrate, such as a silicon wafer, may have an array of one or more discrete elements formed on the surface of the substrate to form a library of elements. Typically, each element in the library has a slightly different chemical composition so that the library represents a variety of new resulting materials which each may then be tested and characterized to identify new materials with novel chemical and/or physical properties. To form each element, it is necessary to deposit one or more target materials in predetermined amounts into predetermined locations. It is desirable to be able to deposit the one or more target materials in varying amounts for the entire library using a single deposition process. To form such libraries, a predetermined gradient of a target material may be formed across the substrate so that the concentration of the target material may, for example, start at a minimum value at one side of the substrate and increase up to a maximum value at the other side of the substrate. Similarly, a gradient of a second target material may be deposited so that the minimum value is, for example, at the side of the substrate with the maximum amount of the first target material so that a variety of different resulting materials with different compositions of the two target materials are formed on the substrate.

FIGS. 1a, 1b and 1c are diagrams illustrating a conventional apparatus 20 for co-depositing target materials onto a substrate 22. FIG. 1b is a graph illustrating the deposition profiles for the target materials deposited by the conventional apparatus and FIG. 1c shows an extension of the conventional method. In the example of this conventional apparatus shown, two materials, A and B, are going to be co-deposited onto the substrate 22. This conventional method and apparatus are described in an article, Joseph J. Hanak, Journal of Materials Science, Vol. 5 (1970) pgs. 964–971.

FIG. 1a is taken from the above-mentioned publication and illustrates the method. In this method, the target is called a composite target since it is composed of more than one section of different target materials (i.e., target material A 24 and target material B 26). The substrate 22 is of strip shape in order to capture the composition variations along the x-axis. The theoretical composition distribution is shown in FIG. 1b. Using this method, it is easy to see that the various target materials 24, 26 are simultaneously deposited onto the substrate in one deposition process so that they are homogeneously mixed with each other. This is one of the major advantages of Hanak's method. It is also easy to see that once the composite target is made, the distribution is, to large extent, fixed and cannot be altered easily. This is one of the major disadvantages of Hanak's method. Alterations of the composition distribution of a given composite target can still be achieved by varying the distance between the target and the substrate and/or locate the substrate at different positions along the x-axis. However, the resulting range of alterations is very limited. In addition, different target materials have different deposition rates if all other conditions are kept the same. Thus, the theoretical distribution of FIG. 1b is usually not realizable (except coincidentally) and therefore Hanak's method is mainly applicable to those target materials having comparable deposition rates. This is another major drawback of Hanak's method. From FIG. 1b, it is also evident that, due to the peak and tail of a component profile (an intrinsic property of the distribution), it is difficult to obtain a library element having such a composition that component A is much greater than component B or vise visa. This is another disadvantage of the method.

Using this same method, target materials may be deposited from a 3-component composite target. Another twist of the multi-component composite target co-deposition scheme is when islands of different target materials are placed on the main target as shown in FIG. 1c and described in an article by J. J. Hanak et al, Journal of Applied Physics, Vol. 43(4) (1972) 1666–1673. This scheme is usefull when target materials B and C are intended to be used as dopant materials or the like, since target material A will be the dominant constituents in the libraries made by such a composite target. This scheme can be trivially extended to more dopant component situations. However, the advantages and disadvantages of the method remain the same. The method is also described in U.S. Pat. No. 3,803,438 which is incorporated herein by reference.

Another technique for forming the combinatorial library using deposition techniques is disclosed in an article entitled, "A Combinatorial Approach to Materials Discovery" by X.-D. Xiang et al., published in Volume 268 of Science on Jun. 23, 1995. In this technique, one or more binary masks are used to create the library. As an example, a first mask which divides the substrate vertically in half is used to deposit target material on a left half of the substrate and then a second mask which divides the substrate horizontally in half is used to deposit target material on a top half of the substrate. A third mask may further divide the substrate into four vertical stripes so that a target material may be deposited in two vertical stripes, and so on. In this manner, a library with an array of elements wherein the resulting material in each element may have a different composition of target materials is formed. In particular, layers of the different target materials may be formed and then the layers may be melted together to form the resulting material. These binary masks may be changed so that the composition of the resulting materials in elements in the library may be altered. The problem with this technique is that the various target materials comprising a particular element in the library are formed in layers so that, without further processing such as heating, the various materials are not homogeneously mixed which is undesirable. Although possible, it is very difficult and inefficient to form component gradients in a library by a series of binary masks.

Another technique is described in U.S. patent application Ser. No. 08/841,423, filed on Apr. 22, 1997 and published PCT Application No. WO 98/47613 (based on International PCT Patent Application No. PCT/US98/07799 filed Apr. 20, 1998) which are assigned to the assignee of the present application and which are both incorporated herein by reference. This technique uses a pair of programmable shutter masks to generate the various masking patterns dynamically so that the system is very flexible. This technique, however, still suffers from the drawbacks of the prior technique in that the materials are not homogeneously mixed at the atomic level without further processing, such as heating. A technique of using these mechanical shutters is also disclosed in an IBM Technical Disclosure Bulletin by E. M. DiSilva et al., IBM Technical Disclosure Bulletin, Vol. 22(7) (1979) 2922.

It is desirable to provide an apparatus and method for simultaneously forming a library with gradients of one or more different target materials. The target materials in the library may be homogeneously mixed during the synthesis of the library so that additional processing is not necessary. The target materials in the library may be formed with gradients and the percentage of each target material in each element in the library is programmable and precisely controlled. Thus, it is desirable to provide a programmable flux gradient apparatus for the co-deposition of materials onto a substrate which solves the above problems and drawbacks with the conventional apparatus and methods and it is to this end that the present invention is directed.

SUMMARY OF THE INVENTION

A co-deposition apparatus and method are provided which may deposit programmable gradients for two or more target materials onto a substrate simultaneously. The apparatus may also homogeneously mix the two or more target materials at an atomic level since the target materials are simultaneously deposited onto the substrate. The apparatus also permits the gradients for each target material to be independently adjustable and programmable. A method for generating an element in a library with two or more target materials having gradients is accomplished with the co-deposition apparatus in accordance with the invention.

The apparatus may include two or more target material sources from which the target material is ejected onto the substrate. The apparatus may be used with sources which are in line-of-sight with the substrate, such as a thermal evaporator, an electron beam evaporator or a very low pressure sputtering source. The apparatus may be used to deposit two different target materials having possibly different gradients, but may also be used to simultaneously deposit more than two different target materials with possibly different gradients onto a substrate. To control the gradients of the target material ejected by the target material sources, the apparatus may include a programmable gradient shutter associated with each target material source so that each gradient shutter associated with each target material source may control the amount of target material deposited on a predefined region of the substrate. The gradient shutters in the apparatus may be computer controlled.

Thus, in accordance with the invention, an apparatus for simultaneously depositing gradients components of two or more target materials onto a substrate is provided. The apparatus comprises a first target material source that directs a first target material towards the substrate and a second target material source that directs a second material towards the substrate. The apparatus further comprises a gradient mask system that controls a first predetermined amount of the first target material and a second predetermined amount of the second target material directed towards the substrate in order to generate gradients of the first and second target materials on the substrate. The gradients of the first and second target materials being simultaneously deposited onto the substrate form a homogenous resulting material. A method for simultaneously depositing gradients of two or more target materials onto a substrate is also provided.

In accordance with another aspect of the invention, a method for forming a region of a library on a substrate is provided in which the region of the library has a resulting material deposited in the region composed of two target materials. The method comprises simultaneously emitting a first target material from a first target material source and a second target material from a second target material source towards the substrate and controlling a first predetermined gradient of the first target material and a second predetermined gradient of the second target material directed towards the substrate in order to form the resulting material having a first predetermined gradient of the first target material and a second predetermined gradient of second target material. The first and second target materials being simultaneously deposited onto the substrate form a homogenous resulting material.

BRIEF DESCRIPTION OF THE DRAWINGS

FIG. 3 is a diagram illustrating a first embodiment of the co-deposition apparatus in accordance with the invention for depositing two different target materials onto a substrate;

FIGS. 6a–6d are diagrams illustrating examples of the programmable gradients for two target materials that have been deposited onto the substrate in accordance with the invention;

DETAILED DESCRIPTION OF A PREFERRED EMBODIMENT

Figure 1A:
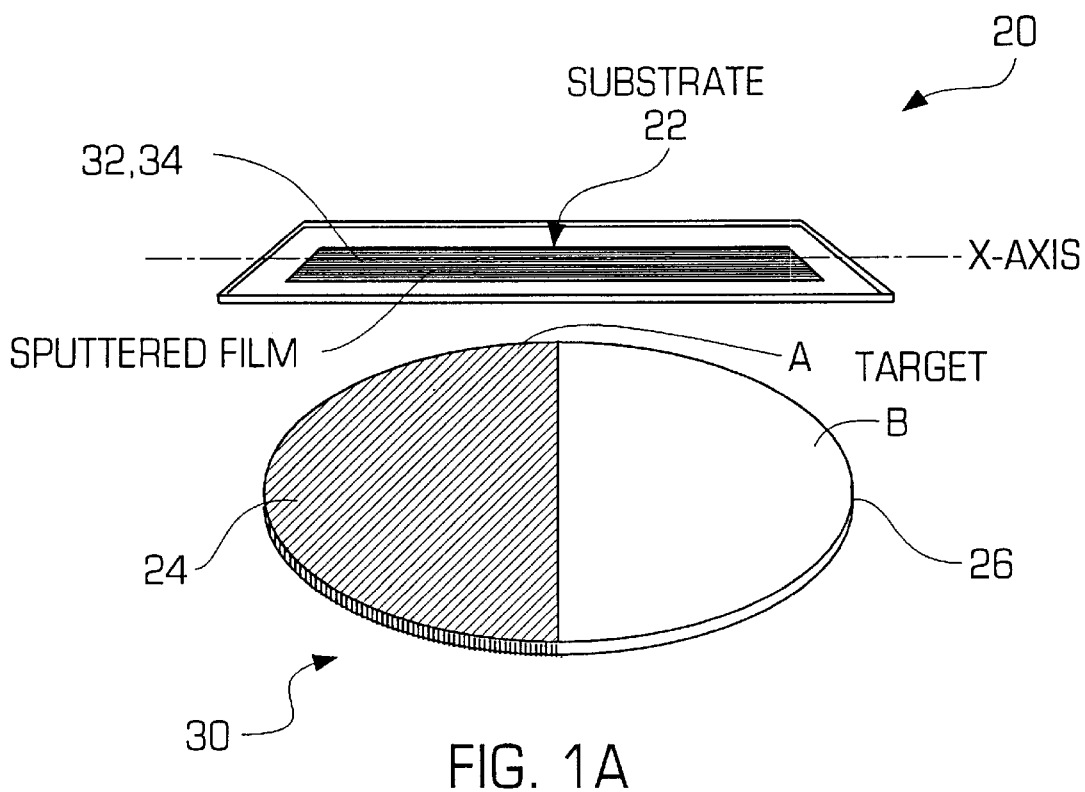
FIGS. 1a, 1b and 1c are diagrams illustrating a conventional apparatus and method for co-depositing target materials onto a substrate.
Figure 1B:
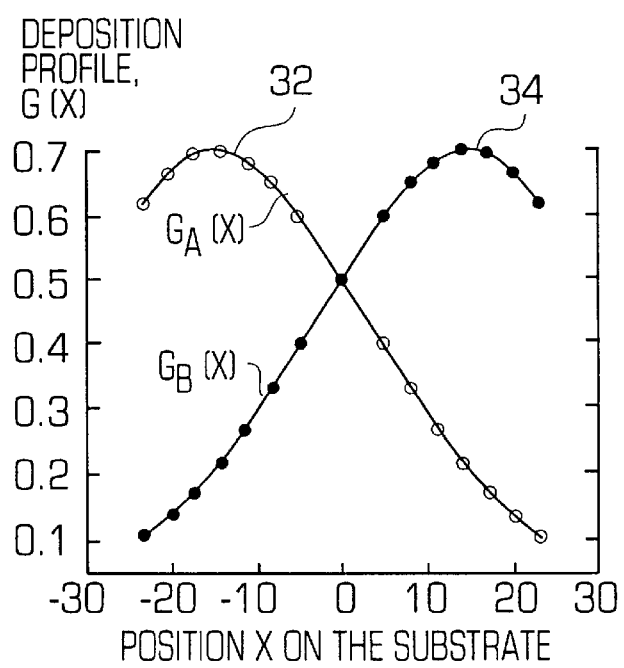
Figure 1C:
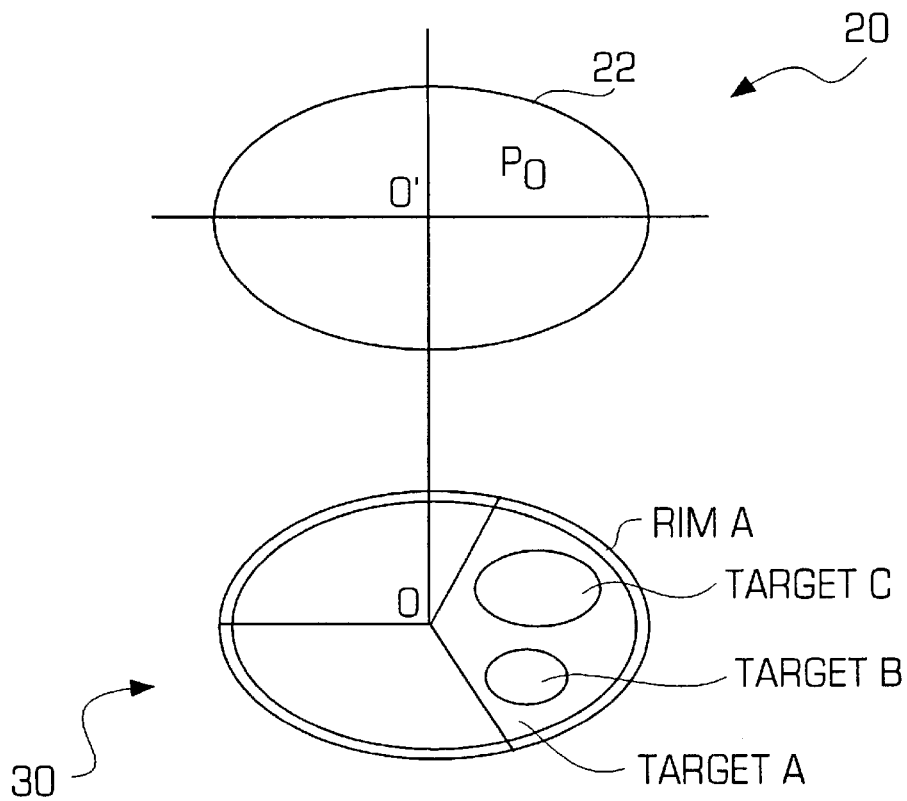

The invention is particularly applicable to a co-deposition apparatus which may be used to deposit one or more target materials having different composition gradients to make up an element of a combinatorial library and it is in this context that the invention will be described. It will be appreciated, however, that the apparatus and method in accordance with the invention has greater utility, such as to producing programmable gradient target material profiles for other types of processes. Prior to describing the invention, a glossary of terms being used in this application will be provided.

Glossary

The following terms are intended to have the following general meanings as they are used herein.

1. Substrate: A substrate is a material having a rigid or semi-rigid surface. In many embodiments, at least one surface of the substrate will be substantially flat, although in some embodiments it may be desirable to physically separate synthesis regions for different materials with, for example, dimples, wells, raised portions, etched trenches or the like. In some embodiments, the substrate itself may contain wells, raised regions, etched trenches, etc. which form all or part of the synthesis regions. The substrate may typically have a surface area of about 1 to 400 $cm^2$ and usually between 6 to 100 $cm^2$. However, it should be understood that the substrate may be substantially smaller or larger than the ranges depending on the particular application. For example, the substrate may have a surface area as small as about 0.1 to 1 $cm^2$ or as large as about 1 to 100 $m^2$. The substrate can be made of a convenient material depending on the components being deposited. For example, the substrate material may be a solid-state compound, an extended solid, an extended solution, a cluster of molecules or atoms, a crystal, etc. as described more fully in U.S. Pat. No. 5,776,359 which is incorporated herein by reference.

2. Predefined Region: A predefined region is a localized area on the substrate which is, was or is intended to be used for the formation of a selected resulting material and is otherwise referred to herein in the alternative as "known" region, "reaction" region, a "selected" region or simply a "region". The predefined region may have any convenient shape, such as linear, circular, rectangular, elliptical, wedge-shaped, etc. The predefined region and therefore the area of the substrate upon which each distinct material is synthesized may be smaller than about 25 $cm^2$, preferably less than 10 $cm^2$ and most preferably less than 0.5 $mm^2$. In most preferred embodiments, the predefined regions may have an area of less than about 10,000 $\mu m^2$, preferably less than 1,000 $\mu m^2$ and more preferably less than 10 $\mu m^2$.

3. Target Material Source: A target material source is a piece of equipment which expels a target material from a target in order to direct the target material towards the substrate. The target material source may expel the target material from the target using a variety of different well known deposition techniques, such as thermal evaporation techniques, sputtering techniques, spraying techniques, laser deposition techniques, ion beam deposition, ion implantation or doping technique as well as other techniques used in the fabrication of integrated circuits and epitaxially grown materials, and preferable with line-of-sight techniques, such as thermal evaporation, electron beam deposition and low pressure sputtering.

4. Component: The term "component" may refer to each of the individual chemical substances that are deposited onto a substrate. The components may act upon one another to produce a particular material. The components may also react with each other, or be acted upon by a third material, chemical substance or energy source. A component may be an element from the periodic table, a chemical, a material, a mixture of elements or chemicals, etc. in variable stoichiometries. The components may react directly with each other or with an external source, or alternatively, they may form layers, blends, mixtures or combinations thereof.

5. Target Material: The term "target material" refers to material which can be composed of elements, compounds, chemicals, molecules, etc. that is vaporized, evaporated, boiled, sublimed, ablated, sprayed, etc. from the exit of a container or holder so that the target material may condense onto a substrate during the synthesis process. Generally, a component, as described above, is the individual chemical substances that are expelled from the target material to be deposited onto the substrate and the component may have the same composition as the target material or it may comprise a portion of the target material.

6. Resulting Material: The term "resulting material" may refer to the component or combination of components that have been deposited onto a substrate optimally in predefined regions. The resulting material may comprise a single component, a combination of components, or components that have reacted directly with each other or with an external source. Alternatively, the resulting material may comprise a layer, blend or mixture of components on a substrate or in a predefined region. The resulting materials, once synthesized, may be screened for performance related to a specific function or useful property.

7. Mixture or Blend: The term "mixture" or "blend" may refer to a collection of molecules, ions, chemical substances, etc. The amount of each component in the mixture may be independently varied. A mixture may consist of two or more substances intermingled with no constant percentage composition wherein each component may or may not retain its essential original properties and molecular phase mixing may or may not occur. In the mixture, the components making up the mixture may or may not remain distinguishable from each other by virtue of their chemical structure.

8. Gradient Shutter: The term "gradient shutter" may refer to a mechanism for blocking target material emitted by a target material source from being deposited onto the substrate or in a predefined region. Typically, the gradient shutter may be located in between the target material source and the substrate. In preferred embodiments, the gradient shutter may be a plate associated with each target material source which may be moved relative to the target material being deposited onto the substrate in order to programmably block some predetermined portion of the target material at predetermined times during the synthesis process. The gradient shutter may be used to form gradients of target materials on predefined regions of the substrate. The system of gradient shutters and associated mechanisms for moving the gradient shutters for all of the target material sources may be referred to as a "gradient shutter system".

9. Gradient: The term "gradient" refers to the fact that the amount of target material deposited on the substrate by the target material source may vary across the substrate to form a gradient of target material. The relationship between the particular amounts of target material deposited may vary to provide a variety of different gradients, such as, for example, a sloped gradient, a dam shaped gradient or a stepped gradient.

DESCRIPTION OF THE PREFERRED EMBODIMENTS

Figure 2:
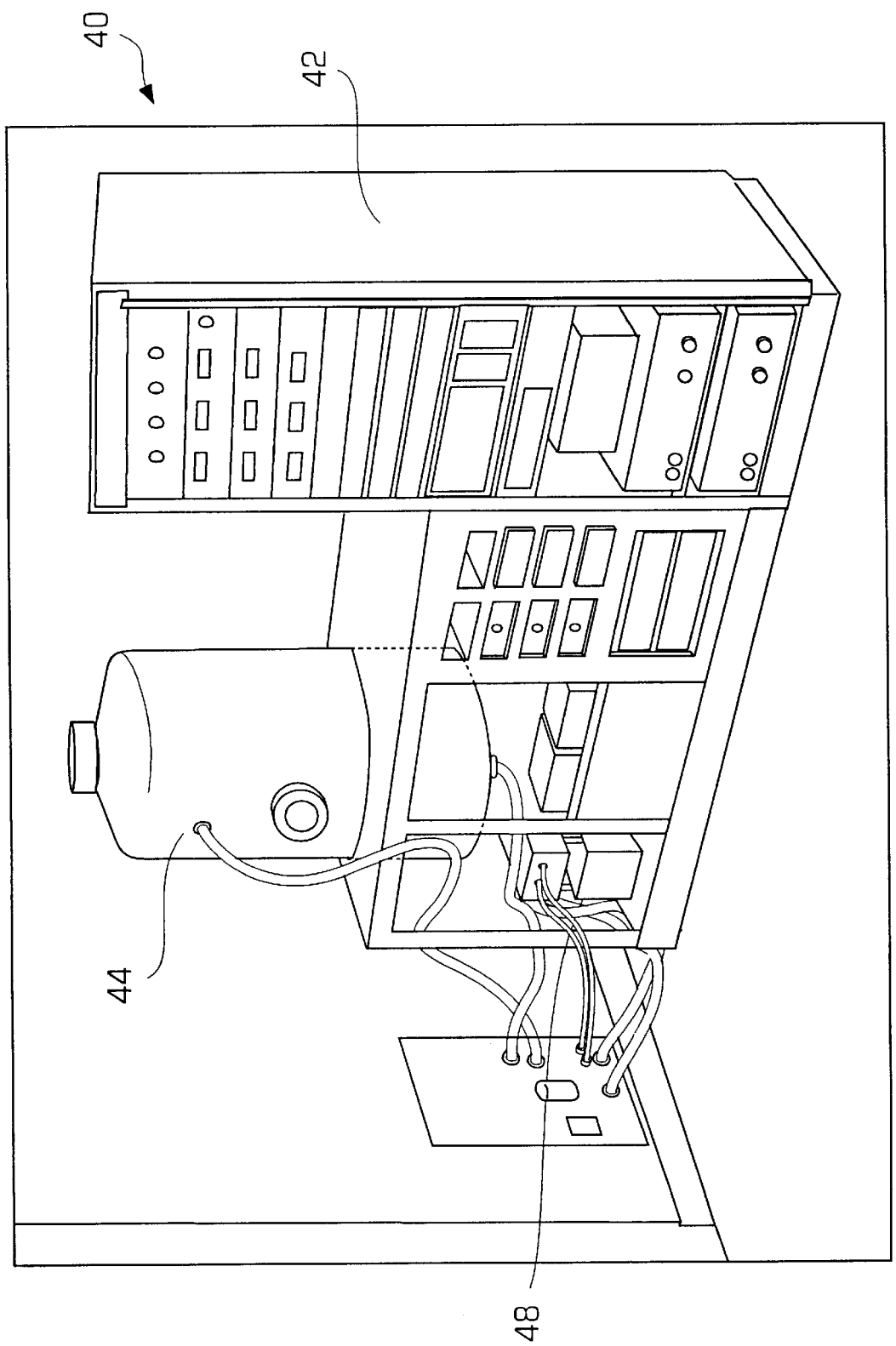
FIG. 2 is a diagram illustrating a co-deposition apparatus in accordance with the invention.

FIG. 2 is a diagram illustrating a co-deposition apparatus 40 in accordance with the invention. The co-deposition apparatus may include a power supply and computer system 42, a deposition chamber 44 from which air may be evacuated, and various equipment 48 which may, for example, evacuate the chamber, control the temperature of each evaporator within the chamber, as described below, and measure the deposition rates onto the substrate using, for example, quartz crystal microbalances. The computer system 42 may include one or more software applications stored in a memory in the computer system and executed by a microprocessor in the computer system in order to control various aspects of the co-deposition apparatus, including, for example, the movement of the gradient shutters to control the gradients for each target material, the temperature of each target material source, which may be an thermal evaporator, the amount each target material being deposited onto the substrate and the like as will be described in more detail below. As will now be described, the co-deposition apparatus in accordance with the invention permits gradients of two or more different target materials to be formed on a substrate. The invention permits gradients of two or more target materials to be formed on a substrate in which the two or more target materials are simultaneously deposited onto the substrate so that the target materials are homogeneously mixed. Unlike the conventional apparatus described above and in accordance with the invention, the gradients being deposited are programmable so that the gradient for each target material may be easily altered. Various embodiments will now be described in which programmable gradients of two, three and six target materials may be co-deposited onto a substrate generally or into predefined regions of a substrate, but it should be understood that the co-deposition apparatus in accordance with the invention, may be used to co-deposit programmable gradients for any number, n, of target materials. Now, a first embodiment of the co-deposition apparatus in which programmable gradients for two different target materials are co-deposited onto a substrate will be described.

FIG. 3 is a diagram illustrating a first embodiment of the co-deposition apparatus 50 in accordance with the invention for co-depositing programmable gradients of two different target materials onto a substrate 52. In this embodiment, the co-deposition apparatus 50 may include a first target material source 54 (Gradient Source A) and a second target material source 56 (Gradient Source B) which are each mounted on a gradient source rail 58 which will be described in more detail below with reference to FIG. 9. The gradient source rails position the target material sources 54, 56 in a predetermined relationship to each other and to a uniform target material source 60 (Uniform Source 1). For example, in this embodiment, the two target material sources may be positioned 180° apart with the uniform source in the middle within the chamber 44 shown in FIG. 2. In one example, the target material sources 54, 56 and the uniform target material source 60 may be thermal evaporators which deposit organic materials onto a substrate which may be located approximately 1 foot above the target material sources. The temperature of each evaporator may be independently controlled using a well known thermocouple feedback loop. In this example, the deposition may be carried out in the chamber 44 of FIG. 2 connected to a cryopump at pressures of about $5 \times 10^{-6}$ torr.

The co-deposition apparatus in accordance with the invention may be used in conjunction with a shuttering system to deposit the programmable gradients of two or more target materials onto, for example, a particular region of a combinatorial library. The physical masking system is described more fully in U.S. patent application Ser. No. 08/841,423, filed Apr. 22, 1997 and in International Publication No. WO 98/47613 (based on International Patent Application No. PCT/US98/07799 filed internationally on Apr. 20, 1998) entitled "Systems and Methods for the Combinatorial Synthesis of Novel Materials" which are assigned to the same assignee as the present invention and are all incorporated herein by reference.

Returning to FIG. 3, the co-deposition apparatus 50 includes the target material sources 54, 56 and the uniform source 60 which are aimed so that the target materials emitted from the target material sources are deposited onto the substrate 52. In the example shown in FIG. 3, no gradient is formed from the target material being deposited by the uniform target material source 60 so that the uniform target material source 60 deposits a uniform amount of target material onto the substrate. To programmably control the gradients of the target material sources 54, 56, a gradient shutter system 62 may be used. The gradient shutter system 62 may include one or more manually adjustable bars 64 which permits the vertical distance between the target material sources 54, 56 and the gradient shutter system 62 to be adjusted for optimum performance. The gradient shutter system 62 may also include one or more horizontal bars 66 which are connected, at one end, to the manually adjustable bars 64 at approximately a right angle. The other ends of the horizontal bars 66 may be attached to a gradient shutter 68 which block predetermined amounts of the target material from each target material source 54, 56 as described below in more detail. The gradient shutter system 62 may further include a motion drive 70, such as a conventional stepper motor, attached to each manually adjustable bar 64 to change the position of the horizontal arm 66 and, in particular, the gradient shutter 68 relative to flux 72, 74 being ejected by each target material source 54, 56 in order to independently, programmably control the gradient of each target material on the substrate.

In accordance with the invention, the co-deposition apparatus 50, shown in FIG. 3, permits programmable gradients for two possibly different target materials to be deposited onto the substrate 52. In addition, since the gradient for each target material is being deposited simultaneously onto the substrate 52, the gradients of the two target materials are homogeneously mixed at the atomic level and thus may not require additional processing steps, such as heating. Now, more details about the technique for depositing programmable gradients of the target materials onto the substrate will be described.

Figure 4A:
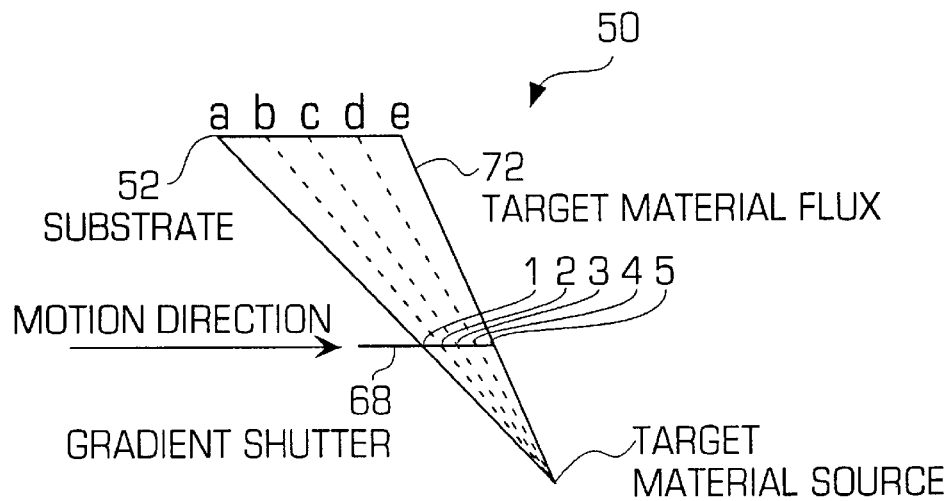
FIGS. 4a and 4b are diagrams illustrating more details of the technique to form a programmable gradient of a target material in accordance with the invention.
Figure 5A:
FIGS. 5a–5c are diagrams illustrating examples of different gradients of a target material which may be formed on a substrate.
Figure 5B:
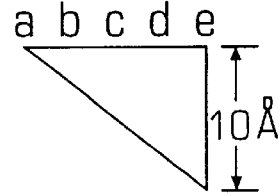

With reference to FIG. 4a, a single target material source and one gradient shutter is shown to illustrate the operation of the apparatus. To help understand the operation, assume that the deposition rate of the target material on the substrate is 1 Å/second. At t=0 seconds, the right edge of the gradient shutter 68 is at position 1 and the entire substrate from positions a–e are exposed to the flux. Next, assume the gradient shutter moves towards the right at a constant velocity. When the right edge of the shutter arrives at position 5 (at t=5 seconds), the entire substrate is blocked from the flux by the shutter. At this moment, the resulting film on the substrate shall look like what is shown in FIG. 5a. Now, suppose, at the moment that the right edge of the shutter arrives at position 5, it reverses its direction of motion and moves left at the same constant velocity as before. Then, as the shutter arrives back at position 1 at t=10 seconds, the resulting film on the substrate shall look like what is shown in FIG. 5b. In summary, after a cycle period of 10 seconds, the shutter moves back to where it starts from and a gradient is formed on the substrate.

Figure 5C:
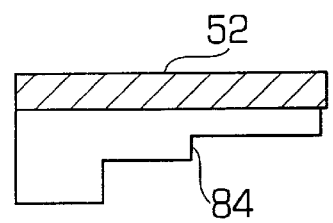

In general, this is how a gradient shutter generates a continuous and slope-like linear gradient. If upon completion of one cycle, the shutter stays at position 1 for certain amount of time (called dwell time) before going on to the next cycle, then a dam-like linear gradient will result. If upon arriving at position 5, the shutter idles for certain amount of time (called idle time) before moving back to position 1 to finish the cycle, then the time period of the cycle will increase but the resulting gradient will not be affected. It is also easy to see that if instead of moving in constant velocity, a shutter jumps from position to position, then a step-like gradient, as shown in FIG. 5c, may be formed.

Figure 4B:
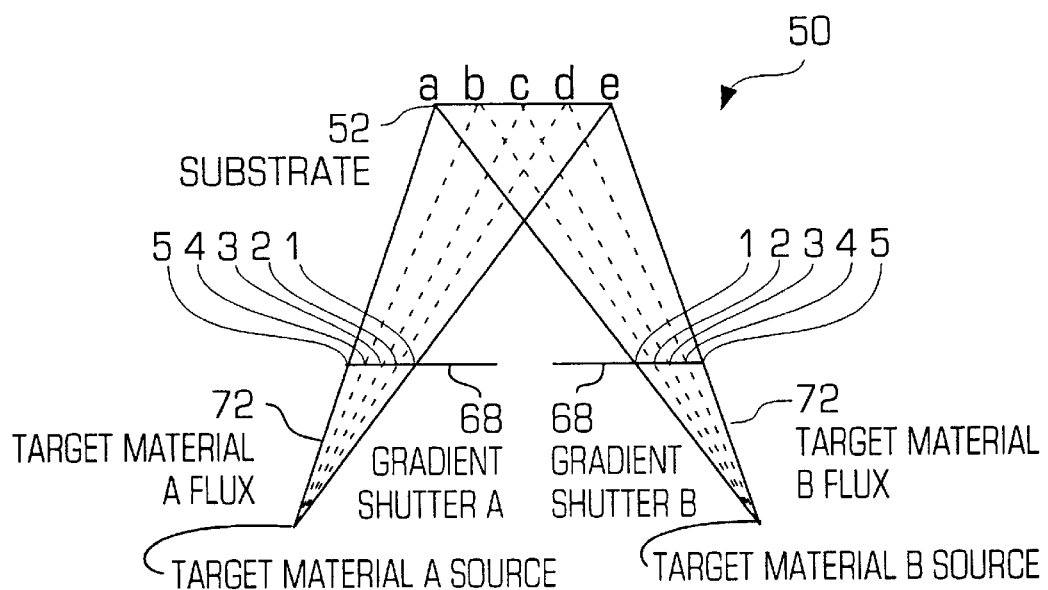

FIG. 4b shows the apparatus 50 with two target material sources and two gradient shutters for co-deposition. To help simplify the understanding of the operation, assume that material A and material B both have exactly the same deposition rate at the substrate (e.g., 1 Å/second). The operation is exactly the same as has been described above in the single source case except that this time there are two sources and two shutters running simultaneously. Consequently, at the end of one cycle of operation, two gradients (each similar to FIG. 5b) are formed on the substrate. The maximum of gradient A is at position a while the maximum of gradient B is at position e. At the middle of the substrate, position c, the amount of material A and material B are half of their maximum, respectively. Since the deposition rates for materials A and B are assumed to be the same, the chemical composition at the middle of the substrate is 1:1, if material A and material B have exactly the same mole density (moles per volume).

FIG. 4b may leads to the illusion that the resulting film from this apparatus is always homogeneous since material A and material B are co-deposited onto the substrate simultaneously. However, this is not necessarily true. To understand this concept, a review of the material deposited on each position on the substrate will be helpful. At point a of the substrate, shutter A never blocks point a from source A. In other words, point a always sees source A and receives flux from source A. Hence, at the end of one cycle of operation (ten seconds), the amount of material A deposited at point a is 10 Å. On the other hand, shutter B always blocks point a from source B so that point a never sees source B and never receives any flux from source B. Hence, at the end of one cycle of operation, the amount of material B deposited at the point a is 0 Å. One can similarly figure out what happens at point e of the substrate. At point c of the substrate during the first 2.5 seconds, point c sees both the source A and B so that the resulting film is homogeneously mixed. During the next 5 seconds, point c cannot see either source, hence there is no film growth in this time period. During the last 2.5 seconds of the cycle, point c sees both sources again. Since the point c sees source A only half the time, the amount of material A deposited at this point is 5 Å. This is also true to material B. Furthermore, since the point c always sees both sources, the resulting film is homogeneous.

Now, we look at the point b of the substrate. During the first 1.25 seconds, it sees both sources, hence the resulting film is homogeneous. During the next 2.5 seconds, point b cannot see source B because it is blocked by shutter B. Hence only flux A arrives at this point. Consequently, a layer of pure material A is formed with a thickness of 2.5 Å. During the next 2.5 seconds, point b cannot see either source so that no film growth occurs during this time period. In the next 2.5 seconds, point b sees source A again but not source B. Consequently, another layer of pure material A is formed with a thickness of 2.5 Å. During the last 1.25 seconds, point b sees both sources and a homogeneous film of 2.5 Å is generated (1.25 Å layer from source A and 1.25 Å layer from source B). Thus, at the end of one cycle of operation, the overall film structure at point b of the substrate is a layer of material A of 5 Å sandwiched by two layers of AB mixture of 2.5 Å each. Note that in the mixture layer AB, material A and B are homogeneously mixed because the flux from sources A and B arrive at the substrate simultaneously during the formation of this layer. Furthermore, in the mixture layer AB, the ratio of material A and material B is 1:1 (if material A and material B have exactly the same mole density), since they have the same deposition rate.

From the above discussion, a general picture of the overall structure of the film on the substrate after one cycle of deposition is formed. That is, on any point of the substrate, the resulting film is a sandwich with one layer of pure material in the middle and two layers of mixture sandwiching it. The AB ratio of the mixture is independent of its location on the substrate (if the deposition rates of the individual sources at the substrate are uniform across the substrate). Thus, at point a of the substrate, the thickness of the mixture layer is zero, and the middle layer is made of material A. At point b, the thickness of the mixture layer is larger than zero and the middle layer is still made of material A but thinner. Note that the total thickness of the sandwich is constant over the entire substrate. At point c, the thickness of the mixture layer reaches maximum and the thickness of the middle layer is zero. At point d, the thickness of the mixture layer becomes thinner again, and the middle layer is made of pure material B. At point e, the thickness of the mixture layer becomes zero again, and the middle layer of material B reaches its maximum thickness. This layer structure for the substrate is shown in FIG. 6a.

FIG. 6a illustrates the film deposited on the substrate after a single cycle of the deposition while FIG. 6b illustrates the film deposited after multiple cycles of the deposition process. These figures realistically describe the overall structure of a resulting film generated by the co-deposition apparatus shown in FIG. 4b only if the total thickness of the film formed in one cycle (FIG. 6a) is sufficiently large. The threshold thickness of the film is on the order of between 10 Å and 100 Å depending on the specific nature of target material A and B as well as deposition conditions such as substrate temperature, kinetic energy of the flux, etc. The above discussion does not, however, imply that only layered structures are generated and consequently the post-synthesis processing, such as heating, is unavoidable as will now be described.

The key is the total thickness of the film generated in one cycle. If this thickness is comparable to the characteristic dimensions of the species involved, e.g., the radius of the atoms, the size of the molecules, etc., then the resulting film will be homogeneous at the atomic level and the pictures in FIG. 6a and 6b will not describe the physical reality anymore. Note that atomic and/or molecular species have finite sizes, typically on the order of a few angstroms or so. Thus, a layer of molecules having a thickness of, e.g., 0.5 Å, should not be conceived as a slab of some sort having 0.5 Å thickness. Rather, it should be viewed in a statistic sense, i.e., it refers to the average thickness of the film. Thus, the real physical difference between a film of 0.5 Å and a film of 1.0 Å is that there are twice more atoms or molecules within the same area in the later film in comparison with the former one. By analogy, one can think of atomic species as grains of sand. A layer of sands can be viewed as a slab only if its thickness is thicker than the characteristic size of the sands. If the thickness is comparable or even smaller than the critical dimension, the slab model will no longer be correct.

The last issue to consider is the deposition rates for source A and source B. For the sake of clarity, assume that the deposition rate of target material B is twice as high as that of the target material A on the substrate. During the deposition process, shutter A runs in the same way as described before while shutter B also starts to move at t=0 seconds, but its velocity is twice as fast as that of shutter A. Thus at t=2.5 seconds, shutter B blocks the entire substrate from seeing the source B. Shutter B then idles at this position for 5 seconds and then moves back towards its initial position with the same velocity. Thus at t=10 seconds, the cycle is completed. The structure of the resulting film is illustrated in FIGS. 6c and 6d. Note that, as before, the A and B ratio in the mixture layer is independent of its position on the substrate. However, the A:B ratio is 1:2 in this case, since the deposition rate of B is twice as high as that of A.

To generate gradients that are homogeneously mixed at atomic level, the total thickness of one cycle should be comparable or even smaller than the characteristic size of the species involved. The cycle time is calculated from this thickness and the deposition rate of the slowest species involved. Idle time is then added to those faster species so that all the species involved will start and complete a cycle simultaneously. Now, a second embodiment of the co-deposition apparatus in accordance with the invention which may deposit programmable gradients for three different target materials will be described.

Figure 7:
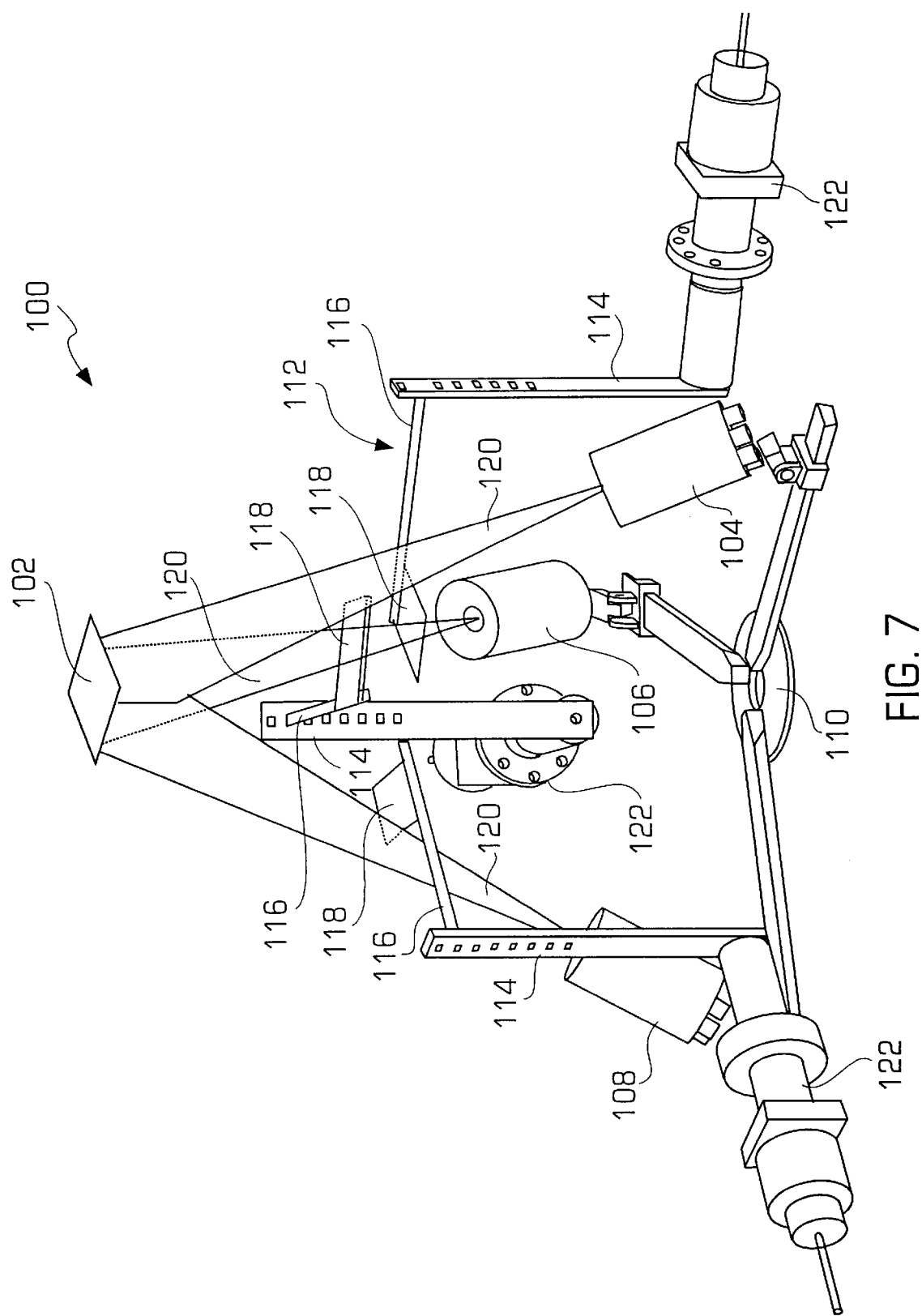
FIG. 7 is a diagram illustrating a second embodiment of the co-deposition apparatus in accordance with the invention for depositing three different target materials onto a substrate.

FIG. 7 is a diagram illustrating a second embodiment of the co-deposition apparatus 100 in accordance with the invention for depositing programmable gradients of three different target materials onto a substrate 102. A target material source A 104, a target material source B 106 and a target material source C 108 may be mounted onto a system of rails 110 so that the position of each target material source may be adjusted as needed. In this embodiment with three target material sources, each target material source may be positioned around a circle at 120° intervals so that a phase-diagram-like library may be synthesized, such as library 130 shown in FIG. 8. Each target material source in this embodiment may be a thermal evaporator, but may also be any other type of equipment which emits a beam of target material towards the substrate 102 as described above. As with the previous embodiment, the apparatus 100 may include a gradient shutter system 112 which independently positions a mechanical gradient shutter in front of each target material source to form a gradient of the target material on the substrate 102. Thus, the gradient shutter system 112 may include a vertical, manually adjustable arm 114 which permits the vertical position of each gradient shutter relative to its associated target material source to be adjusted as desired. The gradient shutter system 112 may also include a horizontal arm 116 attached at one end to each vertical arm 114 and attached at the other end to a gradient shutter 118. Each gradient shutter 118 may be programmably positioned in front of the flux 120 of an associated target material source 104–108 in order to change the amount of target material which is deposited onto the substrate during a predetermined time period. As above, it is the gradient shutters 118 which permits gradients of the target materials to be formed on the substrate. Each gradient shutter may be independently programmable so that the gradient for each target material may be independently adjustable. To automatically position the gradient shutters, each gradient shutter 118 may include a motor 122, such as a stepper motor, which positions the gradient shutter in a horizontal direction with respect to the flux 120. Thus, in accordance with this embodiment of the invention, programmable gradients for three different target materials may be deposited onto the substrate as will now be described with reference to FIG. 8.

Figure 8:
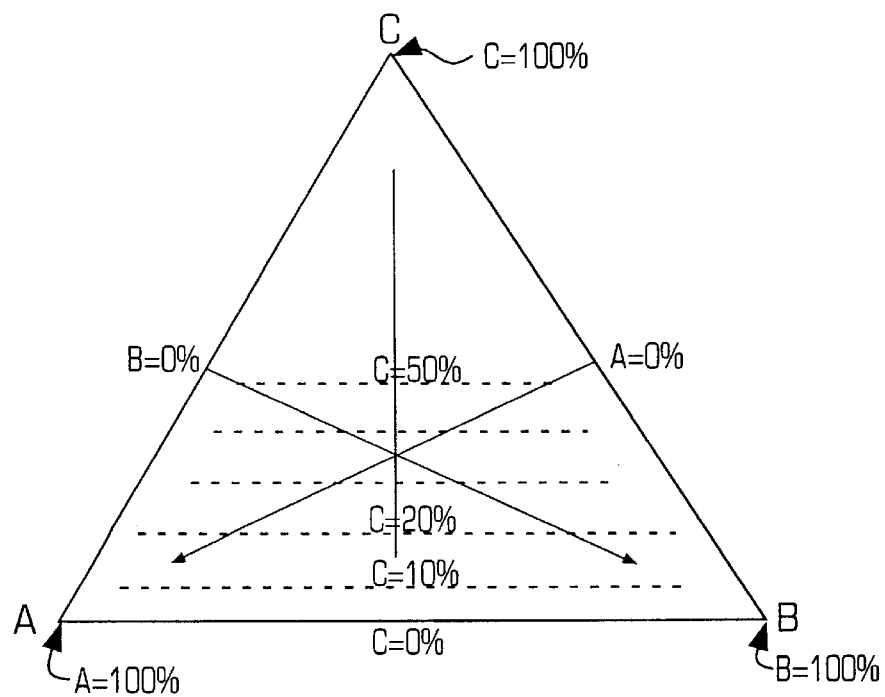
FIG. 8 is a diagram illustrating gradients for three target materials that have been deposited onto the substrate in accordance with the invention.

FIG. 8 is a diagram illustrating an example of a library 130 having gradients of three target materials that has been deposited onto the substrate in accordance with the invention. In this example of the library, gradients of target material A, target material B and target material C may have been deposited onto the substrate. The gradients of the target materials are positioned so that a triangular library is formed on the substrate. In particular, there may be 0% of target material A at one side of the triangle and 100% of A at an opposite corner of the triangle as shown in FIG. 8. Similarly, there may be 0% of target materials B and C at one side of the triangle and 100% of B and C at opposite corners of the triangle. In this manner, the library formed has a plurality of elements in which each element may have a resulting material with a predetermined composition which includes target materials A, B, and C in varying proportions. For example, at the corners of the triangle, the resulting materials are composed of 100% of target material A, 100% of target material B or 100% of target material C, respectively. As shown for target material C, as the elements are farther away from the starting point (C=0%), the resulting material in the elements contain a greater percentage of target material C. Thus, using the co-deposition technique, a library containing elements with resulting materials composed of all possible combinations of target materials A, B, and C may be formed and the resulting material in each element is homogeneously mixed without the need to perform a heating and melting processing step. Now, a third embodiment of the invention will be described in which gradients for up to six target materials may be formed on the substrate.

Figure 9:
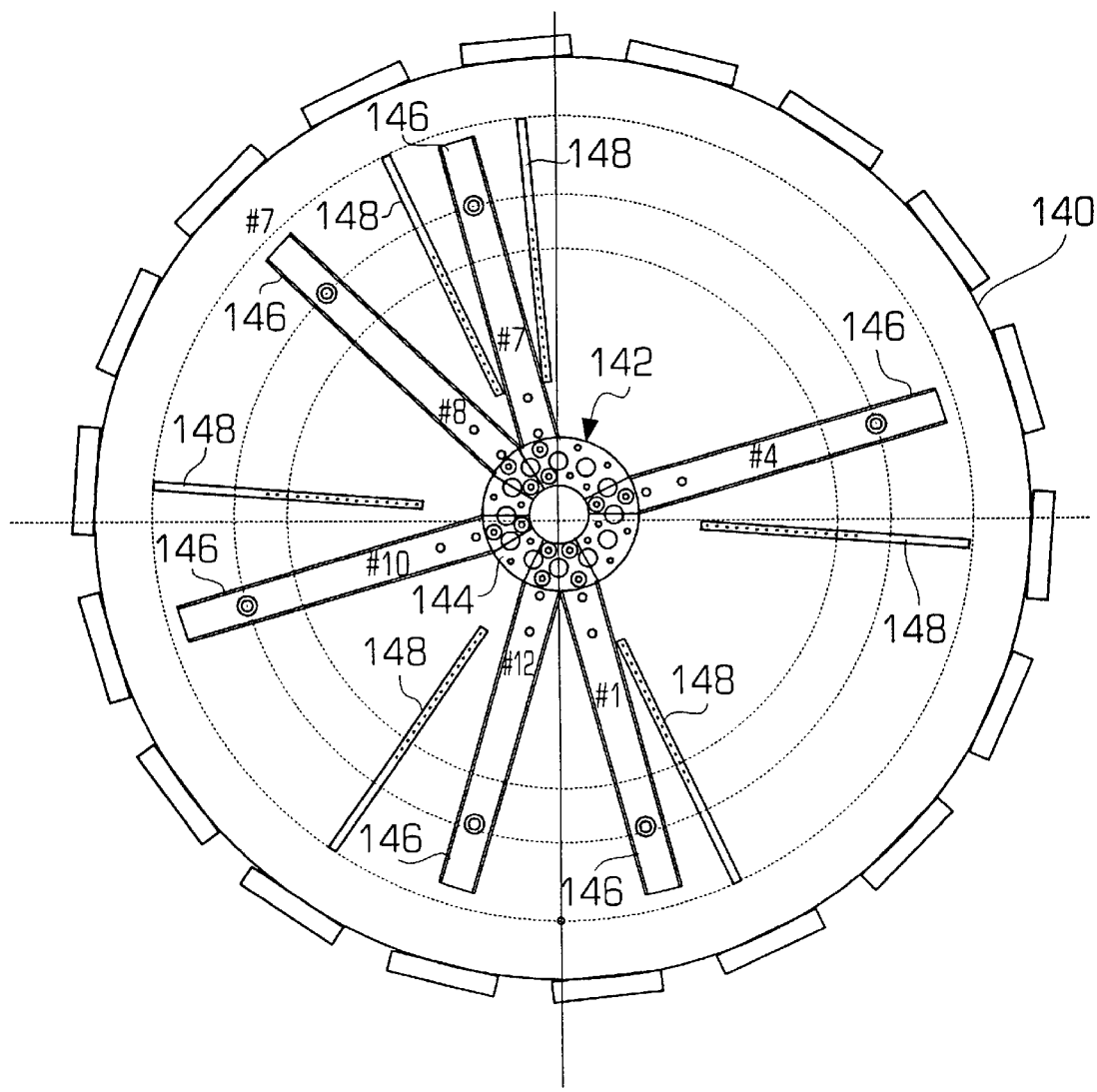
FIG. 9 is a bottom view of the co-deposition apparatus illustrating a third embodiment of the co-deposition apparatus in accordance with the invention for depositing six different target materials onto a substrate.

FIG. 9 is a bottom view of a co-deposition apparatus 140 illustrating a third embodiment of the co-deposition apparatus in accordance with the invention for depositing gradients of six different target materials onto a substrate. For this embodiment, the target material sources and the gradient shutter system are similar to that described above so these elements will not be described here. For example, for this embodiment, there may be six target material sources and the gradient shutter system may include six gradient shutters wherein each gradient shutter is associated with a particular target material source, as above. As shown, there may be a rail system 142 which includes a central connecting ring 144 and one or more target material source rails 146 onto which the target material sources are mounted. The rails 146 permit the position of the target material sources to be varied along the radii of the co-deposition apparatus. In accordance with the invention, one or more target material sources may be attached to the rails 146 so that the co-deposition apparatus 140 may be used to co-deposit gradients for one or more target materials as described above with reference to FIGS. 3 and 7.

In addition to the rail system 142, the co-deposition apparatus 140 may include a gradient shutter system that may include one or more horizontal arms 148 as described above onto which a gradient shutter (not shown) may be attached. Each gradient mask, as described above, may be independently positionable in front of the flux for its associated target material source to block some predetermined portion of the flux as described above. Thus, using the apparatus 140 shown in FIG. 9, programmable gradients for one or more different target materials may be deposited onto a substrate, such as a combinatorial library, to form a plurality of different resulting materials. The target materials which are deposited may be homogeneously mixed since the target materials are being simultaneously deposited onto the substrate.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. An apparatus for simultaneously depositing independent gradients components of two or more target materials onto a substrate, the apparatus comprising:
   a first target material source that directs flux of a first target material towards the substrate;
   a second target material source that directs flux of a second material towards the substrate; and
   a gradient shutter system for independently blocking a first predetermined amount of the flux of the first target material and a second predetermined amount of the flux of the second target material directed towards the substrate having a first gradient shutter that blocks the flux from the first target material and a second gradient shutter that blocks the flux of the second target material in order to generate independent gradients of the first and second target materials on the substrate, the gradients of the first and second target materials intersecting, and being simultaneously deposited onto the substrate to form a homogenous resulting material.

2. The apparatus of claim 1, wherein the gradient shutter system further comprises a controller for independently controlling the position of the first and second gradient shutters in order to independently alter the gradients of the first and second target materials.

3. The apparatus of claim 2, wherein the gradient shutter system further comprises a motor and driving mechanism attached to each of the first and second gradient shutters for independently positioning the gradient shutters.

4. The apparatus of claim 3, wherein the target material sources comprise a thermal evaporator.

5. The apparatus of claim 3, wherein the target material source comprise electron beam evaporation systems.

6. The apparatus of claim 3, wherein the target material sources comprise sputtering systems having a pressure of about $5\times10^{-6}$ torr.

7. The apparatus of claim 1 further comprising a third target material source that directs a third material towards the substrate, and wherein said gradient shutter system further comprises a third gradient shutter which limits the amount of third target material deposited onto the substrate to form an independent gradient of the third target material on the substrate, the first, second and third target material sources being positioned at predetermined locations.

8. An apparatus for simultaneously depositing gradients components of two or more target materials onto a substrate, the apparatus comprising:
   a first target material source that directs flux of a first target material towards the substrate;
   a second target material source that directs flux of a second material towards the substrate; and
   a gradient shutter system for independently blocking a first predetermined amount of the flux of the first target material and a second predetermined amount of the flux of the second target material directed towards the substrate having a first gradient shutter that blocks the flux from the first target material and a second gradient shutter that blocks the flux of the second target material in order to generate independent gradients of the first and second target materials on the substrate, the gradients of the first and second target materials interesting, and being simultaneously deposited onto the substrate to form a homogenous resulting material and a controller for independently controlling the position of the first and second gradient shutters in order to independently alter the gradients of the first and second target materials.

9. The apparatus of claim 8, wherein the gradient shutter system further comprises a motor and driving mechanism attached to each of the first and second gradient shutters for independently positioning the gradient shutters.

10. The apparatus of claim 8, further comprising a third target material source that directs a third material towards the substrate, and wherein said gradient shutter system further comprises a third gradient shutter which limits the amount of third target material deposited onto the substrate to form a gradient of the third target material on the substrate, the first, second and third target material sources being positioned at predetermined locations.

11. The apparatus of claim 10, wherein the target material sources comprise a thermal evaporator.

12. The apparatus of claim 10, wherein the target material source comprise electron beam evaporation systems.

13. The apparatus of claim 10, wherein the target material sources comprise sputtering systems having a pressure of about $5\times10^{-6}$ torr.

14. An apparatus for simultaneously depositing gradients components of two or more target materials onto a substrate, the apparatus comprising:
   a first target material source that directs flux of a first target material towards the substrate;
   a second target material source that directs flux of a second material towards the substrate;
   a third target material source that directed flux from a third material towards the substrate; and
   a gradient shutter system for independently blocking a first predetermined amount of the flux of the first target material, a second predetermined amount of the flux of the second target material and a third predetermined amount of the flux of the third target material directed towards the substrate;
   the gradient shutter system comprising a first gradient shutter that blocks the flux from the first target material, a second gradient shutter that blocks the flux of the second target material and a third gradient shutter that blocks the flux of the third target material in order to generate independent gradients of the first, second and third target materials on the substrate, the gradients of the first, second and third target materials intersecting, and being simultaneously deposited onto the substrate to form a homogenous resulting material.

15. The apparatus of claim 14, therein each gradient shutter further comprises a controller for independently controlling the position of the first, second and third gradient shutters in order to independently alter the gradients of the first, second and third target materials.

16. The apparatus of claim 15, wherein the gradient shutter system further comprises a motor and driving mechanism attached to each of the first, second and third gradient shutters for independently positioning the gradient shutters.

17. The apparatus of claim 16, wherein the target material sources comprise a thermal evaporator.

18. The apparatus of claim 16, wherein the target material source comprise electron beam evaporation systems.

19. The apparatus of claim 16, wherein the target material sources comprise sputtering systems having a pressure of about $5\times10^{-6}$ torr.

* * * * *

UNITED STATES PATENT AND TRADEMARK OFFICE
CERTIFICATE OF CORRECTION

PATENT NO. : 6,364,956 B1　　　　　　　　　　　　　　　　　　　　　　　Page 1 of 1
DATED : April 2, 2002
INVENTOR(S) : Wang et al.

It is certified that error appears in the above-identified patent and that said Letters Patent is hereby corrected as shown below:

Column 13,
Line 67, "interesting," should be replaced with -- intersecting, --

Column 14,
Line 50, "therein" should be replaced with -- wherein --

Signed and Sealed this

Eleventh Day of March, 2003

JAMES E. ROGAN
*Director of the United States Patent and Trademark Office*